(12) United States Patent
Bu

(10) Patent No.: US 7,514,940 B1
(45) Date of Patent: Apr. 7, 2009

(54) SYSTEM AND METHOD FOR DETERMINING EFFECTIVE CHANNEL DIMENSIONS OF METAL OXIDE SEMICONDUCTOR DEVICES

(75) Inventor: Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 292 days.

(21) Appl. No.: 11/637,972

(22) Filed: Dec. 13, 2006

(51) Int. Cl.
*G01R 27/08* (2006.01)

(52) U.S. Cl. .................. 324/716; 324/719; 324/756; 324/766; 703/4; 703/13; 257/296; 257/365; 438/7

(58) Field of Classification Search .............. 324/716, 324/719
See application file for complete search history.

(56) References Cited

U.S. PATENT DOCUMENTS

| | | | | |
|---|---|---|---|---|
| 3,974,443 | A * | 8/1976 | Thomas .................... 324/716 |
| 4,024,561 | A * | 5/1977 | Ghatalia .................... 257/365 |
| 4,672,314 | A * | 6/1987 | Kokkas .................... 324/765 |
| 5,485,097 | A * | 1/1996 | Wang ........................ 324/765 |
| 6,246,973 | B1 * | 6/2001 | Sekine ........................ 703/4 |
| 6,275,972 | B1 * | 8/2001 | Long et al. ..................... 716/5 |
| 6,456,082 | B2 * | 9/2002 | Nowak et al. ............... 324/458 |
| 6,559,672 | B2 * | 5/2003 | Yamaguchi ................. 324/769 |
| 6,727,724 | B2 * | 4/2004 | Yamaguchi ................. 324/769 |
| 6,731,130 | B1 * | 5/2004 | Yang et al. .................. 324/766 |
| 6,859,748 | B1 | 2/2005 | Yang et al. |
| 6,885,214 | B1 | 4/2005 | Su et al. |
| 7,038,469 | B2 | 5/2006 | Coutu |
| 7,263,477 | B2 * | 8/2007 | Chen et al. .................... 703/13 |
| 2002/0102752 | A1 * | 8/2002 | Huang et al. .................. 438/17 |
| 2002/0167034 | A1 * | 11/2002 | Yamaguchi et al. ......... 257/296 |
| 2002/0182757 | A1 * | 12/2002 | Conchieri et al. .............. 438/7 |
| 2004/0021473 | A1 * | 2/2004 | Tsai et al. ................... 324/716 |
| 2006/0071676 | A1 * | 4/2006 | Chen et al. .................. 324/719 |

OTHER PUBLICATIONS

Makoto Sasaki et al., "A New Method to Determine Effective Channel Length, Series Resistance and Threshold Voltage," Proceedings of the 1996 IEEE International Conference on Microelectronic Test Structures, vol. 9, Mar. 1996, pp. 139-144.

* cited by examiner

*Primary Examiner*—Timothy J Dole
*Assistant Examiner*—Benjamin M Baldridge

(57) ABSTRACT

A system and method are disclosed for determining the effective channel width (Weff) and the effective channel length (Leff) of metal oxide semiconductor devices. One advantageous embodiment of the method provides a plurality of metal oxide semiconductor field effect transistor capacitors in which each capacitor has a same value of drawn channel length but a different value of drawn channel width. A value of Fowler-Nordheim tunneling current is measured from each capacitor. Channel width offset is the difference between the drawn channel width and the effective channel width. A value of channel width offset is obtained from the measured values of the Fowler-Nordheim tunneling currents and used to determine the value of effective channel width. A similar method is used to determine the value of the effective channel length.

20 Claims, 5 Drawing Sheets

SYSTEM AND METHOD FOR DETERMINING EFFECTIVE CHANNEL DIMENSIONS OF METAL OXIDE SEMICONDUCTOR DEVICES

TECHNICAL FIELD OF THE INVENTION

The present invention is generally directed to the manufacture of integrated circuits and, in particular, to a system and method for determining effective channel dimensions of metal oxide semiconductor (MOS) devices.

BACKGROUND OF THE INVENTION

An effective channel dimension on silicon of a metal oxide semiconductor (MOS) device is usually different from the dimension that is drawn on a mask layout. This is due to the fact that the wafer fabrication process inevitably results in some dimension offset during the manufacturing process. For example, in modern isolation trench processes, the corner of the silicon of the MOS device is often rounded to avoid any degradation of reliability that may be introduced by the presence of a sharp corner.

FIG. 1 illustrates a schematic diagram showing a cross sectional view of a prior art metal oxide semiconductor (MOS) device 100 showing a discrepancy between a drawn channel width (Wdrawn) and an effective channel width (Weff) on silicon. The drawn channel width (Wdrawn) represents the width of the channel as drawn on the mask layout. As shown in FIG. 1, the corner rounding performed in the isolation trench process consumes silicon and reduces the channel width of the MOS device. The resulting effective channel width is designated as Weff.

The effective channel length of a MOS device may also be less than the drawn channel length. FIG. 2 illustrates a schematic diagram showing a cross sectional view of a prior art metal oxide semiconductor (MOS) device 200 showing a discrepancy between a drawn channel length (Ldrawn) and an effective channel length (Leff) on silicon. The drawn channel length (Ldrawn) represents the length of the channel as drawn on the mask layout. As shown in FIG. 2, source/drain/channel/halo implant diffusion during the manufacturing process reduces the channel length of the MOS device. The resulting effective channel length is designated as Leff.

In the manufacture of MOS devices it is very important to be able to determine how much the effective channel width and the effective channel length deviate from their respective drawn dimensions. Knowledge of the effective channel dimensions is required for MOS device performance optimization and reliability enhancement. This is particularly so for analog MOS devices that require more accurate current-voltage (I-V) control.

In addition, an effective method for determining effective channel width and effective channel length would help save process research and development (R&D) time and would significantly lower manufacturing costs. For example, several factors can cause the output current of a MOS device to be off target. The ratio of the effective channel width to the effective channel length (Weff/Leff) of a MOS device is linearly proportional to the output current of the MOS device. Therefore, an effective method for determining the values of the effective channel width (Weff) and the effective channel length (Leff) can greatly assist a failure analysis process by confirming or excluding a major factor in the failure analysis.

One prior art approach to determining the effective channel length (Leff) of MOS devices was described in a paper by Makoto Sasaki et al. entitled "A New Method to Determine Effective Channel Length, Series Resistance and Threshold Voltage," Proceedings of the 1996 IEEE International Conference on Microelectronic Test Structures, Volume 9, pp. 139-144, March 1996. The Sasaki method determines the effective channel length (Leff) by measuring the drain current of a set of metal oxide semiconductor field effect transistors (MOSFETs) with different drawn channel lengths (Ldrawn).

The Sasaki method notes that while biasing the channel in a strong inversion region, a linear relationship exists between the reciprocal of the gain (b) and the drawn channel length (Ldrawn). The x-intercept of this linear line is the difference between the drawn channel length (Ldrawn) and the effective channel length (Leff). The Sasaki method can obtain several device parameters at the same time, including the source/drain series resistance, the threshold voltage (Vth), and the effective channel length (Leff).

The drawback of the Sasaki method (and other similar approaches) is that it strongly depends on the drain current (Id) and gate voltage (Vg) theoretical model that it employs. Many factors, such as short channel effect, surface mobility degradation and interface density, may cause the Sasaki theoretical model to deviate from the underlying reality and thus give inaccurate results.

A prior art approach to determining the effective oxide thickness of MOS devices was described in U.S. Pat. No. 5,485,097 that issued on Jan. 16, 1996 to Larry Wang entitled "Method of Electrically Measuring a Thin Oxide Thickness by Tunnel Voltage." The Wang method measures the gate oxide thickness (Tox) of a metal oxide semiconductor field effect transistor (MOSFET) by employing Fowler-Nordheim (FN) tunneling theory. The Fowler-Nordheim (FN) tunneling current density ($J_{FN}$) is given by the expression:

$$J_{FN} = \alpha E_{OX}^2 \exp\left(-\frac{\beta}{E_{OX}}\right) \qquad \text{Eq. (1)}$$

where $E_{OX}$ is the electric field across the tunnel oxide and where $\alpha$ and $\beta$ are physical parameters that are related to the oxide fabrication process. The electric field $E_{OX}$ is equal to the bias voltage $V_{OX}$ divided by the oxide thickness $T_{OX}$. With a known bias voltage $V_{OX}$ the oxide thickness $T_{OX}$ can be determined from the value of the Fowler-Nordheim (FN) tunneling current density ($J_{FN}$) with some calibration of the $\alpha$ and $\beta$ parameters that are determined by a particular fabrication process.

The Wang method is suitable for fast and high volume data collection in a manufacturing facility. However, the Wang method does not enable one to measure the effective channel length (Leff) or the effective channel width (Weff) of a MOS device. The Wang method assumes that the values of the effective channel length (Leff) and the effective channel width (Weff) are known already.

Therefore, there is a need in the art for a system and method that is capable of determining the effective channel dimensions of metal oxide semiconductor (MOS) devices. There is a need in the art for a system and a method that is capable of determining the effective channel width (Weff) and the effective channel length (Leff) of a metal oxide semiconductor (MOS) device.

One advantageous embodiment of the method of the present invention provides a plurality of metal oxide semiconductor field effect transistor (MOSFET) capacitors. Each capacitor has a same value of drawn channel length but a different value of drawn channel width. A value of Fowler-Nordheim tunneling current is measured from each capacitor. The channel width offset is the difference between the drawn channel width and the effective channel width. A value of the channel width offset is obtained from the measured values of the Fowler-Nordheim tunneling currents and is then used to determine the value of the effective channel width (Weff). A similar method is used to determine the value of the effective channel length (Leff).

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 3 through 10, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged metal oxide semiconductor (MOS) device.

The present invention provides a system and method for measuring the effective channel dimensions of a metal oxide semiconductor (MOS) device. The system and method of the present invention will first be described with respect to the measurement of the effective channel width (Weff). The present invention measures the effective channel width (Weff) using information from a plurality of metal oxide semiconductor field effect transistor (MOSFET) capacitors.

Figure 1:
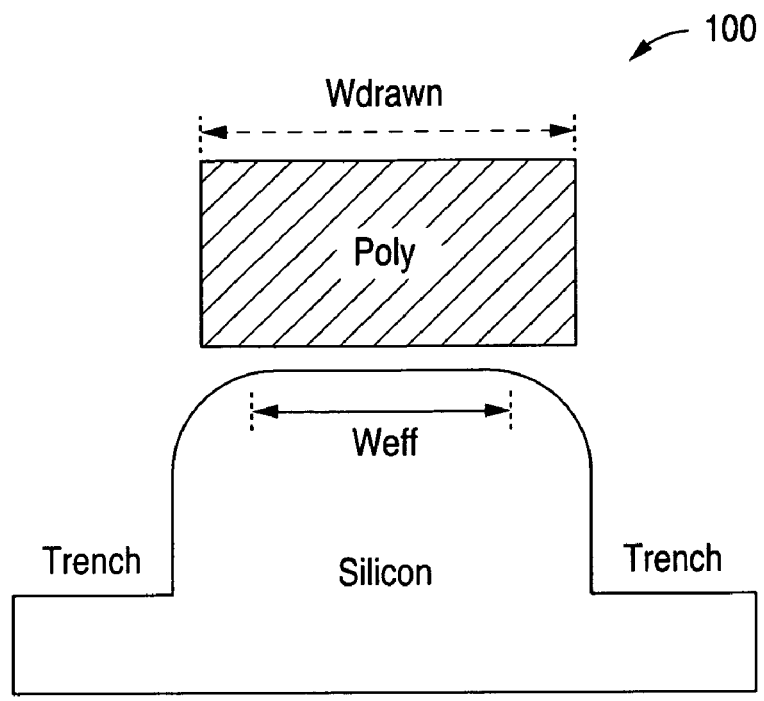
FIG. 1 illustrates a schematic diagram showing a cross sectional view of a prior art metal oxide semiconductor (MOS) device showing a discrepancy between a drawn channel width (Wdrawn) and an effective channel width (Weff) on silicon.
Figure 2:
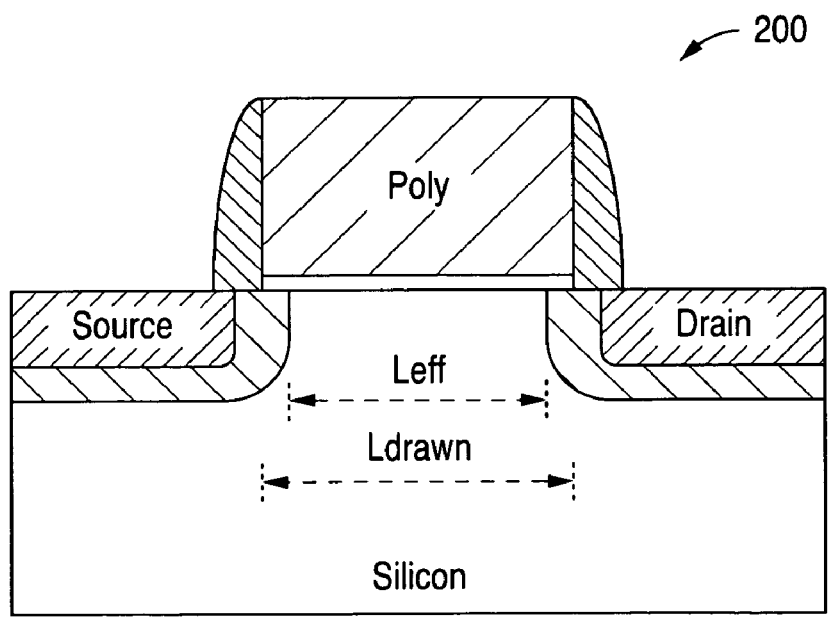
FIG. 2 illustrates a schematic diagram showing a cross sectional view of a prior art metal oxide semiconductor (MOS) device showing a discrepancy between a drawn channel length (Ldrawn) and an effective channel length (Leff) on silicon.
Figure 3:
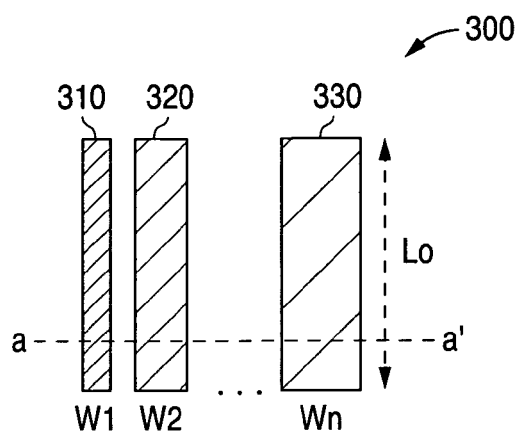
FIG. 3 illustrates a schematic diagram showing a plan view of a plurality of metal oxide semiconductor field effect transistor (MOSFET) capacitors of the present invention in which each capacitor has a different value of width (W1, W2, ..., Wn) and the same value of length (Lo)

FIG. 3 illustrates a schematic diagram showing a plan view of a plurality of metal oxide semiconductor field effect transistor (MOSFET) capacitors 300 of the present invention in which each capacitor has a different value of width. The first capacitor 310 has a width W1 and a length Lo. The second capacitor 320 has a width W2 and a length Lo. The nth capacitor 330 has a width Wn and a length Lo. The MOSFET capacitors 300 are sometimes referred to as the Group 1 MOSFET capacitors 300.

The MOSFET capacitors 300 go through the same fabrication process as standard MOSFET transistors, except that there are only contacts made to the gate (designated terminal G for gate) and to the well (designated terminal B for body). The source and drain of the MOSFET capacitors 300 are left floating (i.e., not connected).

Figure 4:
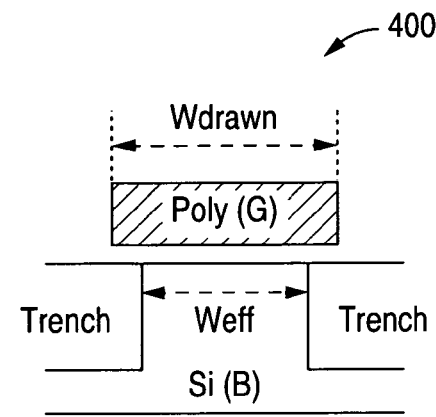
FIG. 4 illustrates a schematic diagram showing an exemplary cross sectional view of one of the metal oxide semiconductor field effect transistor (MOSFET) capacitors of the present invention showing a discrepancy between a drawn channel width (Wdrawn) and an effective channel width (Weff) on silicon.

FIG. 4 illustrates a schematic diagram 400 showing an exemplary cross sectional view of one of the metal oxide semiconductor field effect transistor (MOSFET) capacitors 300 of the present invention. The cross sectional view 400 is taken across one capacitor along the line a-a' of FIG. 3. As shown in FIG. 4, there is a discrepancy between the drawn channel width (Wdrawn) and the effective channel width (Weff) on silicon in the MOSFET capacitor.

In one exemplary embodiment of the present invention in an eighteen hundredths micron (0.18 μm) manufacturing process, the MOSFET capacitors 300 may have the following widths. The first capacitor 310 has a width W1 of eighteen hundredths of a micron (0.18 μm). The second capacitor 320 has a width W2 of twenty two hundredths of a micron (0.22 μm). Continuing in this manner up the nth capacitor, the nth capacitor 330 has a width Wn of one half of a micron (0.50 μm). The length Lo of each of the MOSFET capacitors 300 is selected to be five microns (5.00 μm).

The channel width offset (designated $\Delta W$) is defined as the difference between the value of the drawn channel width (Wdrawn) and the value of the effective channel width (Weff).

$$\Delta W = W\text{drawn} - W\text{eff} \qquad \text{Eq. (2)}$$

The channel width offset ΔW between the drawn channel width (Wdrawn) and the effective channel width (Weff) is usually less than one tenth of a micron (0.1 μm). The channel length offset ΔL between the drawn channel length (Ldrawn) and the effective channel length (Leff) is usually less than one tenth of a micron (0.1 Δm). Therefore, the length Lo of each of the Group 1 capacitors 300 is selected to be much larger than the channel length offset ΔL. The length Lo of the Group 1 capacitors 300 is selected to be much larger than the channel length offset ΔL so that the dominant factor that causes the Fowler-Nordheim (FN) tunneling current variation in the Group 1 capacitors 300 in the method described below is the channel width offset ΔW.

Figure 5:
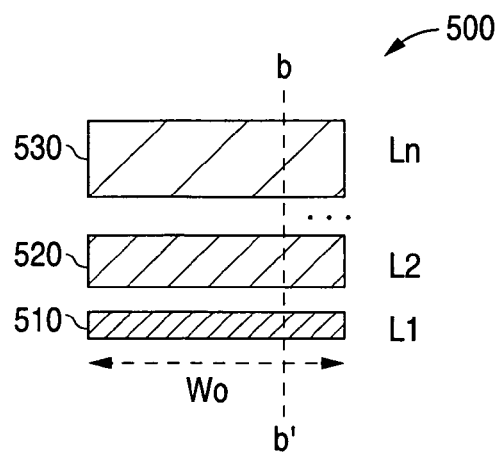
FIG. 5 illustrates a schematic diagram showing a plan view of a plurality of metal oxide semiconductor field effect transistor (MOSFET) capacitors of the present invention in which each capacitor has a different value of length (L1, L2, ..., Ln) and the same value of width (Wo)

FIG. 5 illustrates a schematic diagram showing a plan view of a plurality of metal oxide semiconductor field effect transistor (MOSFET) capacitors 500 of the present invention in which each capacitor has a different value of length. The first capacitor 510 has a length L1 and a width Wo. The second capacitor 520 has a length L2 and a width Lo. The nth capacitor 530 has a length Ln and a width Wo. The MOSFET capacitors 500 are sometimes referred to as the Group 2 MOSFET capacitors 500.

The MOSFET capacitors 500 go through the same fabrication process as standard MOSFET transistors, except that there are only contacts made to the gate (designated terminal G for gate) and to the well (designated terminal B for body). The source and drain of the MOSFET capacitors 500 are left floating (i.e., not connected).

Figure 6:
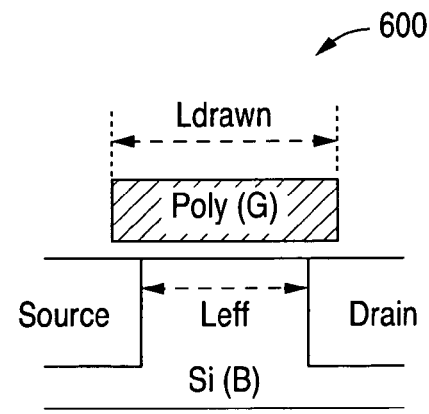
FIG. 6 illustrates a schematic diagram showing an exemplary cross sectional view of one of the metal oxide semiconductor field effect transistor (MOSFET) capacitors of the present invention showing a discrepancy between a drawn channel length (Ldrawn) and an effective channel length (Leff) on silicon.

FIG. 6 illustrates a schematic diagram 600 showing an exemplary cross sectional view of one of the metal oxide semiconductor field effect transistor (MOSFET) capacitors 500 of the present invention. The cross sectional view 600 is taken across one capacitor along the line b-b' of FIG. 5. As shown in FIG. 6, there is a discrepancy between the drawn channel length (Ldrawn) and the effective channel length (Leff) on silicon in the MOSFET capacitor.

In one exemplary embodiment of the present invention in an eighteen hundredths micron (0.18 μm) manufacturing process, the MOSFET capacitors 500 may have the following lengths. The first capacitor 510 has a length L1 of eighteen hundredths of a micron (0.18 μm). The second capacitor 520 has a length L2 of twenty two hundredths of a micron (0.22 μm). Continuing in this manner up the nth capacitor, the nth capacitor 530 has a length Ln of one half of a micron (0.50 μm). The width Wo of each of the MOSFET capacitors 500 is selected to be five microns (5.00 μm).

The channel length offset (designated ΔL) is defined as the difference between the value of the drawn channel length (Ldrawn) and the value of the effective channel length (Leff).

$$\Delta L = L\text{drawn} - L\text{eff} \qquad \text{Eq. (3)}$$

The channel length offset ΔL between the drawn channel length (Ldrawn) and the effective channel length (Leff) is usually less than one tenth of a micron (0.1 μm). The channel width offset ΔW between the drawn channel width (Wdrawn) and the effective channel width (Weff) is usually less than one tenth of a micron (0.1 μm). Therefore, the width Wo of each of the Group 2 capacitors 500 is selected to be much larger than the channel width offset ΔL. The width Wo is selected to be much larger than the channel width offset ΔW so that the dominant factor that causes the Fowler-Nordheim (FN) tunneling current variation in the Group 2 capacitors 500 in the method described below is the channel length offset ΔL.

The method of the present invention is designed to determine the value of the effective channel width (Weff) of the Group 1 capacitors 300 from the known values of their various widths (W1, W2, . . . , Wn). An appropriate electric field is applied to bias the channel of each capacitor into an accumulation mode. Biasing the channel into an accumulation mode will make sure that the source/drain region is separated from the channel region.

The Fowler-Nordheim (FN) tunneling current ($I_{FN}$) of each capacitor is then obtained by multiplying the Fowler-Nordheim (FN) tunneling current density ($J_{FN}$) by the effective area of the capacitor.

$$I_{FN} = (\text{effective area})(J_{FN}) \qquad \text{Eq. (4)}$$

The Fowler-Nordheim (FN) tunneling current density ($J_{FN}$) has a value that is given by Equation (1). The effective area is equal to the effective width (Weff) of the capacitor times the effective length (Leff) of the capacitor.

$$I_{FN} = (W\text{eff})(L\text{eff})(J_{FN}) \qquad \text{Eq. (5)}$$

Using the expression for Weff from Equation (2) and the expression for Leff from Equation (3) one obtains $$I_{FN} = (W\text{drawn} - \Delta W)(L\text{drawn} - \Delta L)(J_{FN}) \qquad \text{Eq. (6)}$$

The fixed length of each of the Group 1 capacitors 300 is Lo. The fixed length Lo is the value of Ldrawn. The value of Lo is much greater than the channel length offset ΔL. That is, Lo>>ΔL. Therefore, the contribution of ΔL can be ignored and the value of the expression (Ldrawn−ΔL) is the fixed length Lo. Therefore Equation (6) becomes $$I_{FN} = (W\text{drawn} - \Delta W)(Lo)(J_{FN}) \qquad \text{Eq. (7)}$$

For the same electric field and the same fabrication process, the Fowler-Nordheim (FN) current density ($J_{FN}$) of each capacitor is the same. Therefore, the Fowler-Nordheim (FN) tunneling current ($I_{FN}$) is solely determined by the dimensions of the capacitor (i.e., the dimension of the effective width (Weff) and the dimension of the effective length (Leff)).

Equation (7) can be rewritten as $$I_{FN} = A(W\text{drawn}) - B \qquad \text{Eq. (8)}$$

where the expression A is given by $$A = (Lo)(J_{FN}) \qquad \text{Eq. (9)}$$

and the expression B is given by $$B = (\Delta W)(Lo)(J_{FN}) \qquad \text{Eq. (10)}$$

Now with the same electrical bias between the gate (terminal G) and the well (terminal B) one can obtain a group of data points from the Group 1 capacitors 300. Each data point represents the value of the Fowler-Nordheim (FN) tunneling current ($I_{FN}$) and the corresponding Wdrawn width of the capacitor. Specifically, capacitor 310 has a Wdrawn width of W1 and a Fowler-Nordheim (FN) tunneling current of $I_{FN1}$. Capacitor 320 has a Wdrawn width of W2 and a Fowler-Nordheim (FN) tunneling current of $I_{FN2}$. Capacitor 330 has a Wdrawn width of Wn and a Fowler-Nordheim (FN) tunneling current of $I_{FNn}$.

Figure 7:
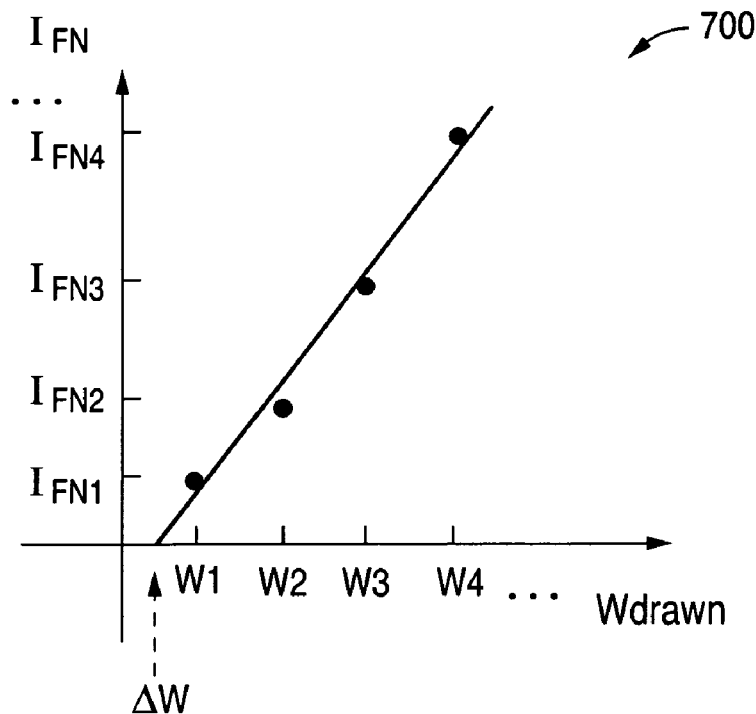
FIG. 7 illustrates a graph of Fowler-Nordheim (FN) tunneling current ($I_{FN}$) versus drawn channel width (Wdrawn) data showing how a channel width offset ($\Delta W$) can be determined.

The data points ($I_{FN1}$, W1), ($I_{FN2}$, W2), . . . , $I_{FNn}$, Wn) are related by Equation (8). The data points can be plotted with the measured Fowler-Nordheim (FN) tunneling current on a y-axis and the known values of Wdrawn width on an x-axis. The result is shown in FIG. 7. FIG. 7 illustrates a graph 700 of the measured Fowler-Nordheim (FN) tunneling current ($I_{FN}$) versus known values of drawn channel width (Wdrawn). The data points define a straight line that represents Equation (8).

As shown in the graph 700, the x-intercept represents the value of the channel width offset ΔW. When the value of the Fowler-Nordheim (FN) tunneling current is zero, then Equation (8) gives a value of B/A for the value of Wdrawn. But this value of Wdrawn is equal to the channel width offset $\Delta W$ because $$\frac{B}{A} = \frac{(\Delta W)(Lo)(J_{FN})}{(Lo)(J_{FN})} = \Delta W \qquad \text{Eq. (11)}$$

This method gives us the value of the channel width offset $\Delta W$. The value of the channel width offset $\Delta W$ is read from the x-intercept of the line in graph 700.

Now that the value of the channel width offset $\Delta W$ has been determined, the effective channel width (Weff) can be obtained by rewriting Equation (2) as follows $$W\text{eff} = W\text{drawn} - \Delta W \qquad \text{Eq. (12)}$$

The effective channel width Weff is equal to the drawn channel width Wdrawn minus the channel width offset $\Delta W$.

The method of the present invention is designed to determine the value of the effective channel length (Leff) of the Group 2 capacitors 500 from the known values of their various lengths (L1, L2, ..., Ln). An appropriate electric field is applied to bias the channel of each capacitor into an accumulation mode. Biasing the channel into an accumulation mode will make sure that the source/drain region is separated from the channel region.

As before, the Fowler-Nordheim (FN) tunneling current ($I_{FN}$) of each capacitor is then obtained by multiplying the Fowler-Nordheim (FN) tunneling current density ($J_{FN}$) by the effective area of the capacitor.

$$I_{FN} = (\text{effective area})(J_{FN}) \qquad \text{Eq. (4)}$$

The Fowler-Nordheim (FN) tunneling current density ($J_{FN}$) has a value that is given by Equation (1). The effective area is equal to the effective width (Weff) of the capacitor times the effective length (Leff) of the capacitor.

$$I_{FN} = (W\text{eff})(L\text{eff})(J_{FN}) \qquad \text{Eq. (5)}$$

Using the expression for Weff from Equation (2) and the expression for Leff from Equation (3) one obtains $$I_{FN} = (W\text{drawn} - \Delta W)(L\text{drawn} - \Delta L)(J_{FN}) \qquad \text{Eq. (6)}$$

The fixed width of each of the Group 2 capacitors 500 is Wo. The fixed width Wo is the value of Wdrawn. The value of Wo is much greater than the channel width offset $\Delta W$. That is, Wo $>>\Delta W$. Therefore, the contribution of $\Delta W$ can be ignored and the value of the expression (Wdrawn−$\Delta W$) is the fixed length Wo. Therefore Equation (6) becomes $$I_{FN} = (Wo)(L\text{drawn} - \Delta L)(J_{FN}) \qquad \text{Eq. (13)}$$

For the same electric field and the same fabrication process, the Fowler-Nordheim (FN) current density ($J_{FN}$) of each capacitor is the same. Therefore, the Fowler-Nordheim (FN) tunneling current ($I_{FN}$) is solely determined by the dimensions of the capacitor (i.e., the dimension of the effective width (Weff) and the dimension of the effective length (Leff)).

Equation (13) can be rewritten as $$I_{FN} = A(L\text{drawn}) - B \qquad \text{Eq. (14)}$$

where the expression A is given by $$A = (WO)(J_{FN}) \qquad \text{Eq. (15)}$$

and the expression B is given by $$B = (\Delta L)(Wo)(J_{FN}) \qquad \text{Eq. (16)}$$

Now with the same electrical bias between the gate (terminal G) and the well (terminal B) one can obtain a group of data points from the Group 2 capacitors 500. Each data point represents the value of the Fowler-Nordheim (FN) tunneling current ($I_{FN}$) and the corresponding Ldrawn length of the capacitor. Specifically, capacitor 510 has an Ldrawn width of L1 and a Fowler-Nordheim (FN) tunneling current of $I_{FN1}$. Capacitor 520 has an Ldrawn length of L2 and a Fowler-Nordheim (FN) tunneling current of $I_{FN2}$. Capacitor 530 has an Ldrawn length of Ln and a Fowler-Nordheim (FN) tunneling current of $I_{FNn}$.

Figure 8:
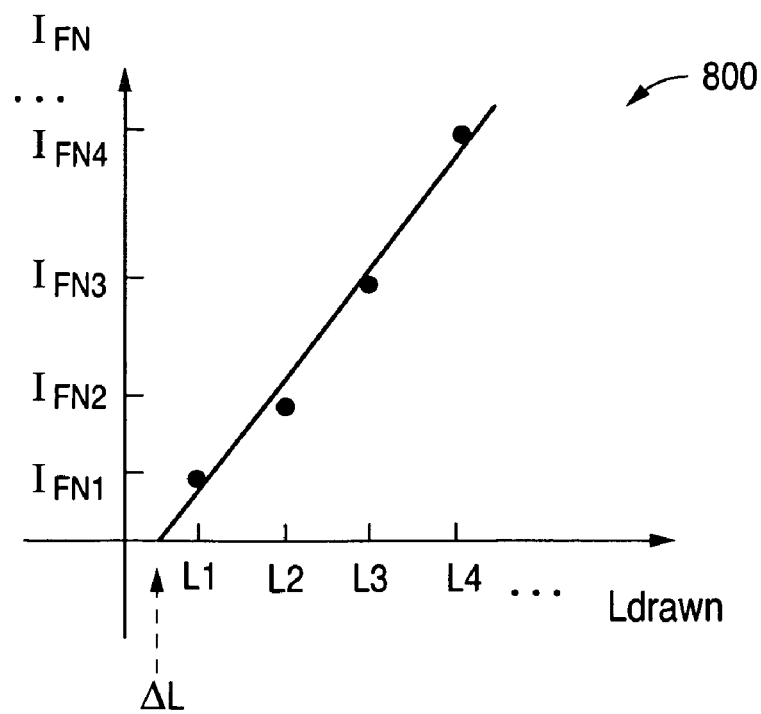
FIG. 8 illustrates a graph of Fowler-Nordheim (FN) tunneling current ($I_{FN}$) versus drawn channel length (Ldrawn) data showing how a channel length offset ($\Delta L$) can be determined.

The data points ($I_{FN1}$, L1), ($I_{FN2}$, L2), ..., ($I_{FNn}$, Ln) are related by Equation (14). The data points can be plotted with the measured Fowler-Nordheim (FN) tunneling current on a y-axis and the known values of Ldrawn length on an x-axis. The result is shown in FIG. 8. FIG. 8 illustrates a graph 800 of the measured Fowler-Nordheim (FN) tunneling current ($I_{FN}$) versus known values of drawn channel length (Ldrawn). The data points define a straight line that represents Equation (14).

As shown in the graph 800, the x-intercept represents the value of the channel length offset $\Delta L$. When the value of the Fowler-Nordheim (FN) tunneling current is zero, then Equation (14) gives a value of B/A for the value of Ldrawn. But this value of Ldrawn is equal to the channel length offset $\Delta L$ because $$\frac{B}{A} = \frac{(\Delta L)(Wo)(J_{FN})}{(Wo)(J_{FN})} = \Delta L \qquad \text{Eq. (17)}$$

This method gives us the value of the channel length offset $\Delta L$. The value of the channel length offset $\Delta L$ is read from the x-intercept of the line in graph 800.

Now that the value of the channel length offset $\Delta L$ has been determined, the effective channel length (Leff) can be obtained by rewriting Equation (3) as follows $$L\text{eff} = L\text{drawn} - \Delta L \qquad \text{Eq. (18)}$$

The effective channel length Leff is equal to the drawn channel length Ldrawn minus the channel length offset $\Delta L$.

The method of the present invention provides the value of the effective channel width Weff and the value of the effective channel length Leff. The known values of Weff and Leff can now be used in Equation (5).

$$I_{FN} = (W\text{eff})(L\text{eff})(J_{FN}) \qquad \text{Eq. (5)}$$

The value of the Fowler-Nordheim (FN) tunneling current density ($J_{FN}$) may be obtained from Equation (1).

The following steps may be taken in order to increase the resolution of the measurements in the present invention. First, the value of the gate (G) to well (B) bias voltage should be set below the value of the gate oxide breakdown voltage Vbd. However, the value of the gate (G) to well (B) bias voltage should be high enough to provide a Fowler-Nordheim (FN) tunneling current that is larger than the noise level of the test unit. A typical value of noise level of the test unit is $10^{-12}$ amperes. For a gate oxide thickness of seventy Ångstroms (70 Å), a preferred value of voltage for the gate (G) to well (B) bias voltage is seven volts (7.0 V).

Second, the area of each capacitor should be large enough to provide a value of Fowler-Nordheim (FN) tunneling current that is larger than the noise level of the test unit. However, the area of each capacitor should be small enough to avoid causing a voltage drop at the gate (G) and well (B) contacts.

Third, it is known that the Fowler-Nordheim (FN) tunneling current will first gradually decrease during constant voltage oxide stress before a jump at the oxide breakdown. Therefore, the initial value of the Fowler-Nordheim (FN) tunneling current should be recorded for higher resolution.

Figure 9:
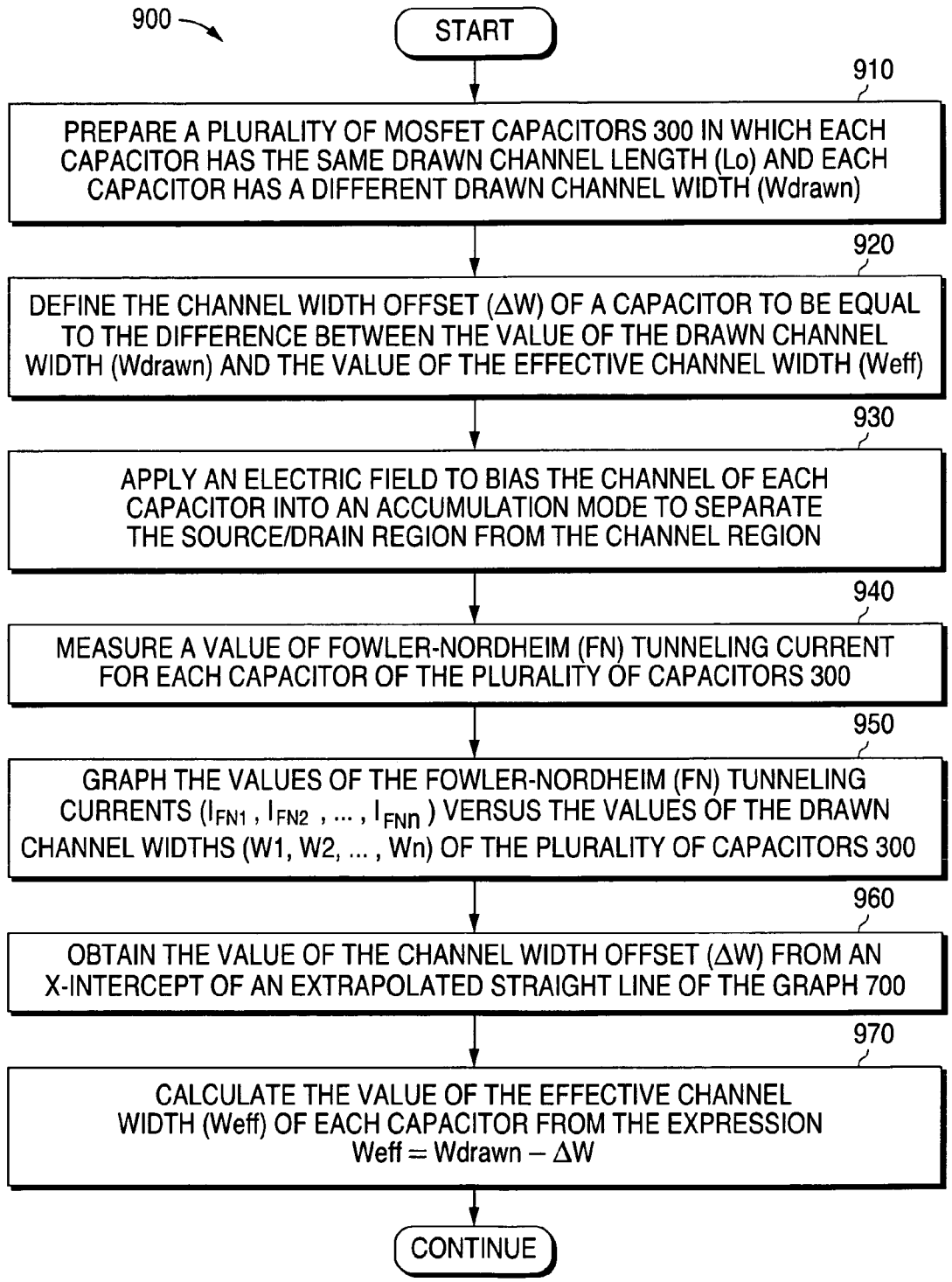
FIG. 9 illustrates a flow chart showing the steps of an advantageous embodiment of a method of the present invention for determining an effective channel width (Weff)

FIG. 9 illustrates a flow chart 900 showing the steps of an advantageous embodiment of a method of the present invention for determining an effective channel width (Weff). In the first step a plurality of MOSFET capacitors 300 are prepared in which each capacitor has the same drawn channel length (Lo) and each capacitor has a different drawn channel width (Wdrawn) (step 910). Then the channel width offset (ΔW) of a capacitor is defined to be equal to the difference between the value of the drawn channel width (Wdrawn) and the value of the effective channel width (Weff) (step 920).

Then an electric field is applied to bias the channel of each capacitor into an accumulation mode in order to separate the source/drain region from the channel region of the capacitor (step 930). Then a value of the Fowler-Nordheim (FN) tunneling current is measured for each capacitor of the plurality of capacitors 300 (step 940).

Then the values of the Fowler-Nordheim (FN) tunneling currents ($I_{FN1}, I_{FN2}, \ldots, I_{FNn}$) are graphed versus the values of the drawn channel widths (W1, W2, ..., Wn) of the plurality of capacitors 300 (step 950). Then the value of the channel width offset (ΔW) is obtained from an x-intercept of an extrapolated straight line of the graph 700 (step 960). Then the value of the effective channel width (Weff) is calculated for each capacitor from the expression Weff=Wdrawn−ΔW (step 970).

Figure 10:
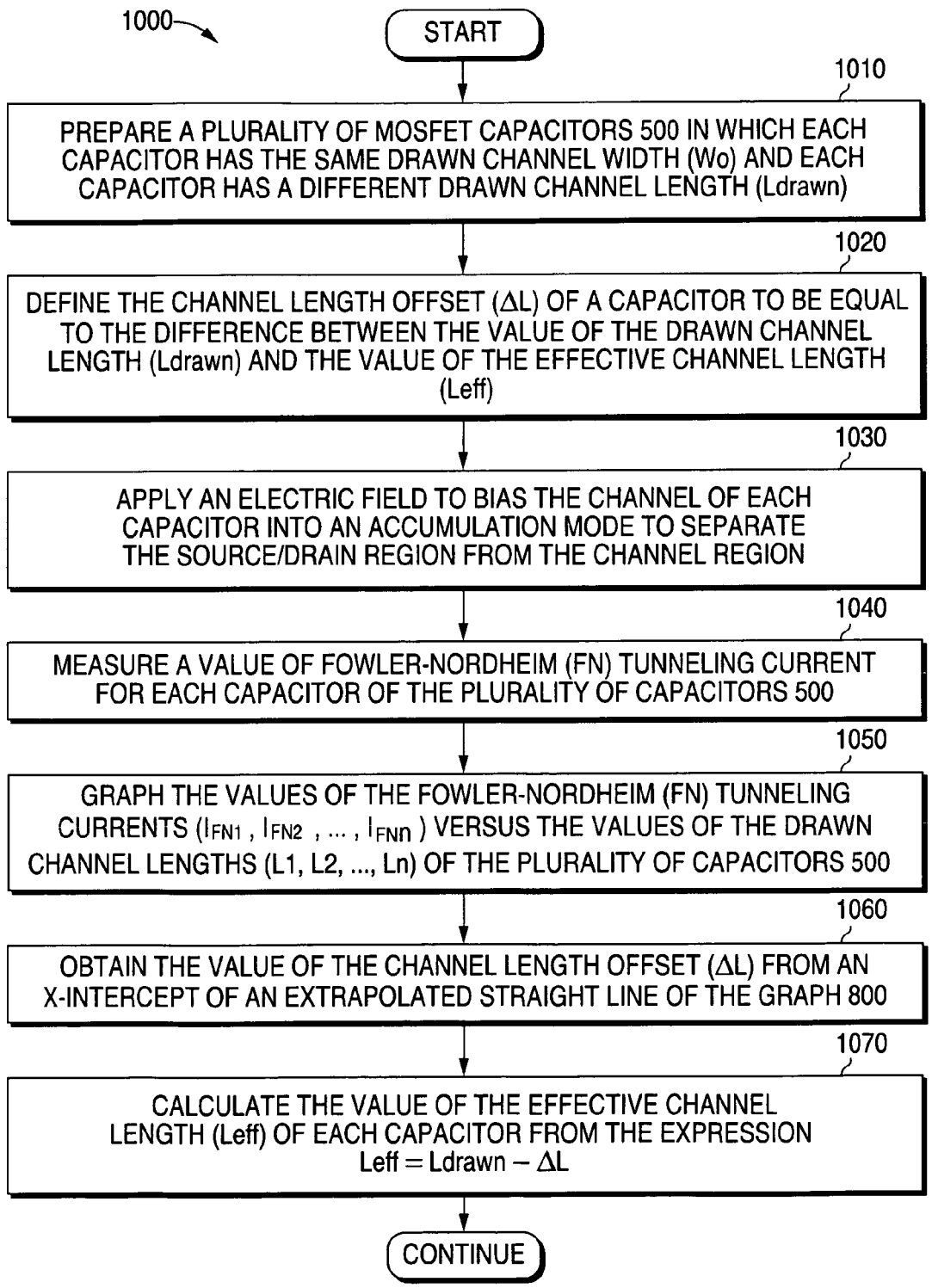
FIG. 10 illustrates a flow chart showing the steps of an advantageous embodiment of a method of the present invention for determining an effective channel length (Leff).

FIG. 10 illustrates a flow chart 1000 showing the steps of an advantageous embodiment of the method of the present invention for determining an effective channel length (Leff). In the first step a plurality of MOSFET capacitors 500 are prepared in which each capacitor has the same drawn channel width (Wo) and each capacitor has a different drawn channel length (Ldrawn) (step 1010). Then the channel length offset (ΔL) of a capacitor is defined to be equal to the difference between the value of the drawn channel length (Ldrawn) and the value of the effective channel length (Leff) (step 1020).

Then an electric field is applied to bias the channel of each capacitor into an accumulation mode in order to separate the source/drain region from the channel region of the capacitor (step 1030). Then a value of the Fowler-Nordheim (FN) tunneling current is measured for each capacitor of the plurality of capacitors 500 (step 1040).

Then the values of the Fowler-Nordheim (FN) tunneling currents ($I_{FN1}, I_{FN2}, \ldots, I_{FNn}$) are graphed versus the values of the drawn channel lengths (L1, L2, ..., Ln) of the plurality of capacitors 500 (step 1050). Then the value of the channel length offset (ΔL) is obtained from an x-intercept of an extrapolated straight line of the graph 800 (step 1060). Then the value of the effective channel length (Leff) is calculated for each capacitor from the expression Leff=Ldrawn−ΔL (step 1070).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for determining a value of an effective channel width of a metal oxide semiconductor device, the method comprising the steps of:

providing a plurality of metal oxide semiconductor field effect transistor devices in which each device has a channel that has a drawn value of channel length that is the same as a drawn value of channel length of each of the other devices and a drawn value of channel width that is different than a drawn channel width of each of the other devices;

measuring a value of Fowler-Nordheim tunneling current from each device of the plurality of devices; and obtaining a value of channel width offset from the measured values of Fowler-Nordheim tunneling current.

2. The method as claimed in claim 1 further comprising the step of:

subtracting said value of channel width offset from a value of drawn channel width of a metal oxide semiconductor device to obtain an effective channel width of said metal oxide semiconductor device.

3. The method as claimed in claim 2 wherein each of said plurality of metal oxide semiconductor field effect transistor devices comprises a capacitor.

4. The method as claimed in claim 3 further comprising the step of:

applying an electric field to bias a channel region of said capacitor into an accumulation mode to separate a source/drain region from said channel region.

5. The method as claimed in claim 1 wherein the step of obtaining a value of channel width offset from the measured values of Fowler-Nordheim tunneling current comprises the steps of:

plotting each measured value of Fowler-Nordheim tunneling current of each device versus a respective value of drawn channel width for each of the plurality of devices;

drawing a best fit straight line through said plotted values; and obtaining a value of channel width offset from an axis intercept of an extrapolation of the best fit straight line.

6. The method as claimed in claim 5 further comprising the step of:

subtracting said value of channel width offset from a value of drawn channel width of a metal oxide semiconductor device to obtain an effective channel width of said metal oxide semiconductor device.

7. The method as claimed in claim 5 further comprising the step of:

selecting a value of said drawn channel length of said plurality of devices to be sufficiently larger than a value of a channel width offset to cause said channel width offset to be a dominant factor that causes variation in Fowler-Nordheim tunneling current in said plurality of devices.

8. A method for determining a value of an effective channel length of a metal oxide semiconductor device, the method comprising the steps of:

providing a plurality of metal oxide semiconductor field effect transistor devices in which each device has a channel that has a drawn value of channel width that is the same as a drawn value of channel width of each of the other devices and a drawn value of channel length that is different than a drawn channel length of each of the other devices;

measuring a value of Fowler-Nordheim tunneling current from each device of the plurality of devices; and obtaining a value of channel length offset from the measured values of Fowler-Nordheim tunneling current.

9. The method as claimed in claim 8 further comprising the step of:

subtracting said value of channel length offset from a value of drawn channel length of a metal oxide semiconductor device to obtain an effective channel length of said metal oxide semiconductor device.

10. The method as claimed in claim 9 wherein each of said plurality of metal oxide semiconductor field effect transistor devices comprises a capacitor.

11. The method as claimed in claim 10 further comprising the step of:

applying an electric field to bias a channel region of said capacitor into an accumulation mode to separate a source/drain region from said channel region.

12. The method as claimed in claim 8 wherein the step of obtaining a value of channel length offset from the measured values of Fowler-Nordheim tunneling current comprises the steps of:

plotting each measured value of Fowler-Nordheim tunneling current of each device versus a respective value of drawn channel length for each of the plurality of devices;

drawing a best fit straight line through said plotted values; and obtaining a value of channel length offset from an axis intercept of an extrapolation of the best fit straight line.

13. The method as claimed in claim 12 further comprising the step of:

subtracting said value of channel length offset from a value of drawn channel length of a metal oxide semiconductor device to obtain an effective channel length of said metal oxide semiconductor device.

14. The method as claimed in claim 12 further comprising the step of:

selecting a value of said drawn channel width of said plurality of devices to be sufficiently larger than a value of a channel length offset to cause said channel length offset to be a dominant factor that causes variation in Fowler-Nordheim tunneling current in said plurality of devices.

15. A method for determining a value of an effective channel width of a metal oxide semiconductor device, the method comprising the steps of:

providing a plurality of metal oxide semiconductor field effect transistor capacitors in which each capacitor has a channel that has a drawn value of channel length that is the same as a drawn value of channel length of each of the other capacitors and a drawn value of channel width that is different than a drawn channel width of each of the other capacitors;

measuring a value of Fowler-Nordheim tunneling current from each capacitor of the plurality of capacitors;

obtaining a value of channel width offset from the measured values of Fowler-Nordheim tunneling current; and subtracting said value of channel width offset from a value of drawn channel width of said metal oxide semiconductor device to obtain an effective channel width of said metal oxide semiconductor device.

16. The method as claimed in claim 15 wherein the step of obtaining a value of channel width offset from the measured values of Fowler-Nordheim tunneling current comprises the steps of:

plotting each measured value of Fowler-Nordheim tunneling current of each capacitor versus a respective value of drawn channel width for each of the plurality of capacitors;

drawing a best fit straight line through said plotted values; and obtaining a value of channel width offset from an axis intercept of an extrapolation of the best fit straight line.

17. The method as claimed in claim 16 further comprising the step of:

selecting a value of said drawn channel length of said plurality of capacitors to be sufficiently larger than a value of a channel width offset to cause said channel width offset to be a dominant factor that causes variation in Fowler-Nordheim tunneling current in said plurality of capacitors.

18. A method for determining a value of an effective channel length of a metal oxide semiconductor device, the method comprising the steps of:

providing a plurality of metal oxide semiconductor field effect transistor capacitors in which each capacitor has a channel that has a drawn value of channel width that is the same as a drawn value of channel width of each of the other capacitors and a drawn value of channel length that is different than a drawn channel length of each of the other capacitors;

measuring a value of Fowler-Nordheim tunneling current from each capacitor of the plurality of capacitors;

obtaining a value of channel length offset from the measured values of Fowler-Nordheim tunneling current; and subtracting said value of channel length offset from a value of drawn channel length of said metal oxide semiconductor device to obtain an effective channel length of said metal oxide semiconductor device.

19. The method as claimed in claim 18 wherein the step of obtaining a value of channel length offset from the measured values of Fowler-Nordheim tunneling current comprises the steps of:

plotting each measured value of Fowler-Nordheim tunneling current of each capacitor versus a respective value of drawn channel length for each of the plurality of capacitors;

drawing a best fit straight line through said plotted values; and obtaining a value of channel length offset from an axis intercept of an extrapolation of the best fit straight line.

20. The method as claimed in claim 19 further comprising the step of:

selecting a value of said drawn channel width of said plurality of capacitors to be sufficiently larger than a value of a channel length offset to cause said channel length offset to be a dominant factor that causes variation in Fowler-Nordheim tunneling current in said plurality of capacitors.

* * * * *